United States Patent [19]

Fisher et al.

[11] Patent Number: 5,544,038
[45] Date of Patent: Aug. 6, 1996

[54] SYNCHRONOUS RECTIFIER PACKAGE FOR HIGH-EFFICIENCY OPERATION

[75] Inventors: Rayette A. Fisher; William A. Hennessy; Herman L. N. Wiegman, all of Schenectady, N.Y.

[73] Assignee: General Electric Company, Schenectady, N.Y.

[21] Appl. No.: 948,051

[22] Filed: Sep. 21, 1992

[51] Int. Cl.$^6$ .................................................. H02M 7/21
[52] U.S. Cl. ........................ 363/147; 363/127; 327/434; 257/368
[58] Field of Search ..................... 363/125, 126, 363/127, 147; 327/434; 257/331, 368; 361/132

[56] References Cited

U.S. PATENT DOCUMENTS

| | | | |
|---|---|---|---|
| 4,656,493 | 4/1987 | Adler et al. | 357/23.4 |
| 4,714,516 | 12/1987 | Eichelberger et al. | 156/628 |
| 4,780,177 | 10/1988 | Wojnarowski et al. | 156/643 |
| 4,783,695 | 11/1988 | Eichelberger et al. | 357/68 |
| 4,829,014 | 5/1989 | Verman | 437/8 |
| 4,835,704 | 5/1989 | Eichelberger et al. | 364/490 |
| 4,857,822 | 8/1989 | Tabisz et al. | 323/282 |
| 4,897,153 | 1/1990 | Cole et al. | 156/643 |
| 4,903,189 | 2/1990 | Neo et al. | 363/127 |
| 4,933,042 | 6/1990 | Eichelberger et al. | 156/239 |
| 4,960,613 | 10/1990 | Cole et al. | 427/53.1 |
| 4,996,116 | 2/1991 | Webster et al. | 428/627 |
| 5,043,859 | 8/1991 | Korman et al. | 363/147 |
| 5,058,799 | 10/1991 | Zsamboky | 228/124 |
| 5,274,541 | 12/1993 | Kimura et al. | 363/147 |

FOREIGN PATENT DOCUMENTS 1084865  4/1986  Japan ..................................... 257/341

*Primary Examiner*—Peter S. Wong
*Assistant Examiner*—Adolf Berhane

[57] ABSTRACT

In a synchronous rectifier package, a Schottky diode is situated in parallel, i.e., with like polarity, with the body diode of a synchronous rectifier. The anode of the Schottky diode is connected directly to the source pad of the synchronous rectifier, and the cathode is directly connected to the drain pad. As a result, the synchronous rectifier package has minimal parasitic inductances and resistances, resulting in a highly efficient synchronous rectifier over a wide range of operating frequencies, even at high frequencies. More precise synchronization of gating signals to each individual cell of the synchronous rectifier is also achieved, further increasing rectification efficiency. The synchronous rectifier package is implemented in either a metallized ceramic structure, or a high-density interconnect structure.

21 Claims, 6 Drawing Sheets

5,544,038

SYNCHRONOUS RECTIFIER PACKAGE FOR HIGH-EFFICIENCY OPERATION

FIELD OF THE INVENTION

The present invention relates generally to synchronous rectifiers and, more particularly, to a highly efficient synchronous rectifier package for both single device and bridge configurations.

BACKGROUND OF THE INVENTION

The parasitic inductances of a synchronous rectifier metal oxide semiconductor field effect transistor (MOSFET) cause dissipative ringing and excessive conduction of the integral body diode of the MOSFET, thereby limiting rectification efficiency. In particular, the integral body diode of a MOSFET typically has a slow reverse recovery, e.g., on the order of 100 nanoseconds, resulting in commutation losses which increase as frequency increases. That is, at turn-off of the MOSFET, the energy that was stored in the parasitic inductances of the MOSFET during its conduction period forces the body diode to carry current. During the subsequent body diode reverse recovery period, the parasitic inductances store energy in the opposite polarity. The stored energy is dissipated in a ring between the parasitic capacitances and inductances of the MOSFET. At high frequencies (e.g., above 300 kHz), these commutation losses are so high as to render use of synchronous rectifiers impractical. Hence, Schottky rectifiers, which have significantly higher forward conduction losses, are typically used for high-frequency rectification.

It has been found that one way to avoid body diode conduction during commutation of a synchronous rectifier is to connect a Schottky diode package in parallel, i.e., with like polarity, with the body diode of the synchronous rectifier package, as described in "A MOSFET Resonant Synchronous Rectifier for High-Frequency DC/DC Converters" by W. A. Tabisz, F. C. Lee and D. Y. Chen, 1990 IEEE Power Electronics Specialist Conference Proceedings, Vol. II, pp. 769–779. For low-frequency operation, such a parallel package configuration results in a slightly higher efficiency. However, at high frequencies, parasitic inductances force the body diode to conduct, rather than the parallel Schottky diode, for the whole commutation period, such that rectification efficiency is not improved.

Accordingly, it is desirable to provide a synchronous rectifier package capable of high-efficiency operation over a wide range of frequencies, i.e., for both low- and high-frequency rectification, and thus render high-frequency synchronous rectification practicable. To this end, it is desirable to reduce or eliminate the wire and lead inductances, while minimizing the device resistances.

SUMMARY OF THE INVENTION

A synchronous rectifier package according to the present invention has minimal parasitic inductances and resistances, resulting in a highly efficient synchronous rectifier over a wide range of operating frequencies, thus rendering synchronous rectification practicable even at high frequencies. In the synchronous rectifier package of the present invention, a Schottky diode is coupled in parallel, i.e., with like polarity, with the body diode of a synchronous rectifier. The anode of the Schottky diode is connected directly to the source pad of the synchronous rectifier, and the cathode is connected directly to the drain pad. Parasitic inductances and resistances of the synchronous rectifier are thus minimized. As a result, during commutation of the synchronous rectifier, the Schottky diode conducts current instead of the body diode, yielding high-efficiency operation.

Additionally, since the parasitic inductances and resistances of the synchronous rectifier package are minimized, the impedance to the gate signal is reduced. Therefore, more precise synchronization of gating signals to each individual cell of the synchronous rectifier is achieved, further increasing rectification efficiency.

The synchronous rectifier package may be implemented in either a metallized ceramic structure or a high density interconnect structure. The principles of the synchronous rectifier package of the present invention apply to both single and bridge synchronous rectifier configurations.

BRIEF DESCRIPTION OF THE DRAWINGS

The features and advantages of the present invention will become apparent from the following detailed description of the invention when read with the accompanying drawings in which.

DETAILED DESCRIPTION OF THE INVENTION

Figure 1:
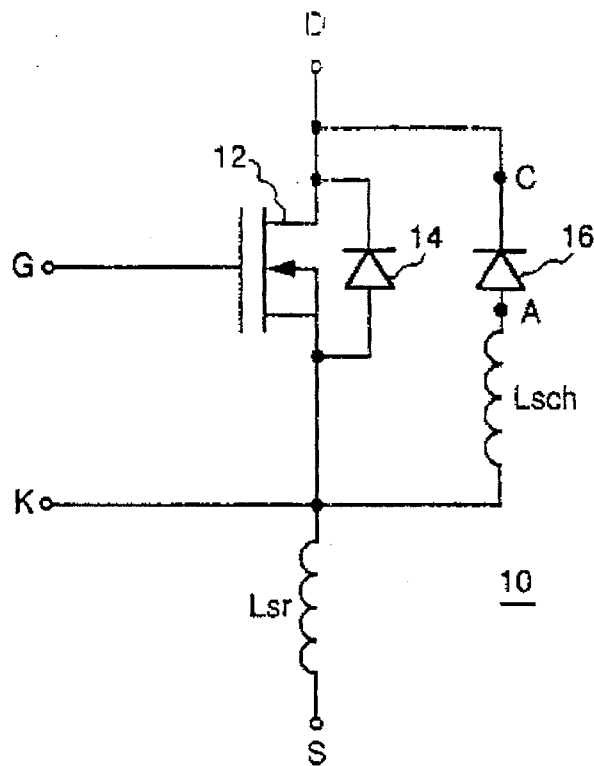
FIG. 1 schematically illustrates a synchronous rectifier, including a parallel-coupled Schottky diode, for packaging according to the present invention.

FIG. 1 schematically illustrates a synchronous rectifier 10 according to the present invention including a MOSFET 12. Those of ordinary skill in the art will appreciate that a synchronous rectifier may comprise a MOSFET operating in the third quadrant such that current flows from the source to the drain of the device. MOSFET 12 includes: gate, source and drain leads, G, S and D, respectively; and an integral body diode 14 coupled in parallel therewith. A Schottky diode 16 is coupled in parallel, i.e., with like polarity, with integral body diode 14. Schottky diode 16 includes a cathode C and an anode A. A Kelvin lead K is shown as being coupled, via a parasitic inductance $L_{sr}$, to source lead S; and, via a parasitic inductance $L_{sch}$, to anode A.

Although a Kelvin lead K, such as that illustrated in FIG. 1, is used in many synchronous rectifier applications for avoiding the introduction of signal noise into the gate G, it is to be understood that a package according to the present invention does not require a Kelvin lead, although one may be used, if desired, as illustrated. In particular, since the packaging technique of the present invention reduces parasitic inductances, and hence noise introduced into the gate, the designer may determine that a Kelvin lead is not needed or desirable for a particular application.

Figure 2:
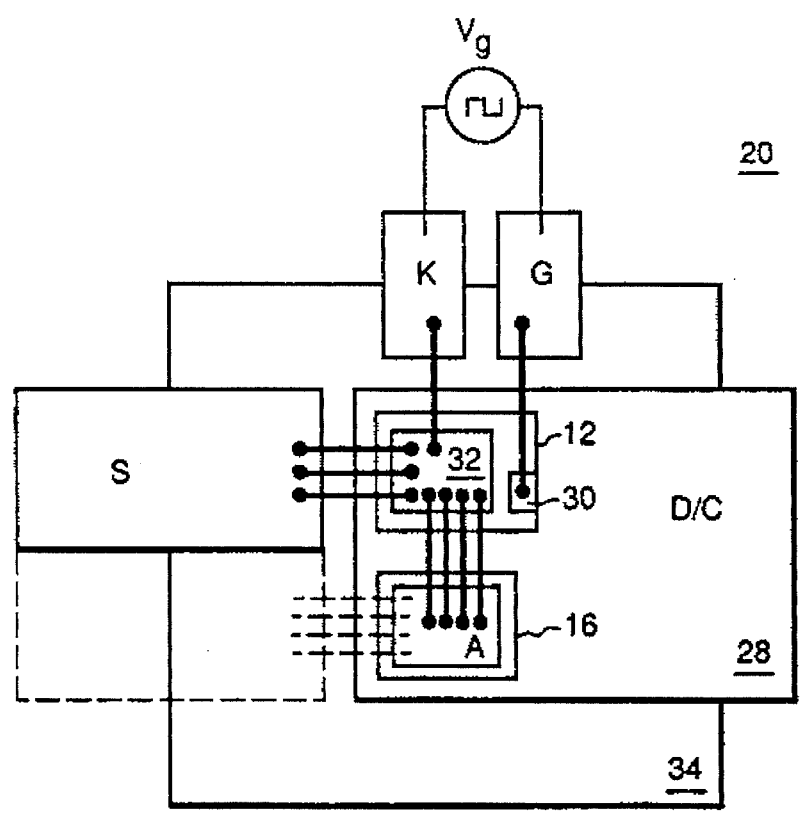
FIG. 2 is a top view illustrating a metallized ceramic package according to the present invention for packaging the synchronous rectifier of FIG. 1.

FIG. 2 illustrates a top view of a metallized ceramic package 20 for packaging synchronous rectifier 10 of FIG. 1. In FIG. 2, a gate excitation voltage Vg is shown as being coupled across the Kelvin and gate leads, K and G, respectively. Package 20 includes a MOSFET die 12 and a Schottky diode die 16 that share a common lead pad 28, e.g., comprised of copper, tungsten or aluminum. (For clarity of illustration, the MOSFET and Schottky diode dice have the same reference numerals as the devices shown in FIG. 1.) MOSFET die 12 includes a gate pad 30 and a source pad 32. In conventional manner, the drain D and the cathode C each comprise the back-plane of the corresponding die. By virtue of the common lead pad 28, the drain D of the MOSFET and the cathode C of the Schottky diode are connected together with minimal parasitic inductance and resistance. The source S, Kelvin K, gate G, and D/C leads are all bonded to or deposited on an insulating substrate 34. A suitable process for bonding a metal to an insulating substrate (referred to as a direct bond process) is described in commonly assigned U.S. Pat. No. 4,996,116 of Webster et al., issued Feb. 26, 1991 and incorporated by reference herein. Another suitable deposition process is described in Zsamboky U.S. Pat. No. 5,058,799, issued Oct. 22, 1991 and incorporated by reference herein.

As shown in FIG. 2, the anode A, source lead S, and Kelvin lead K are each wire bonded to the source pad 32. The gate lead G is wire bonded to gate pad 30. As shown, for the source pad connections to the source lead S and the anode A, a plurality of wires of relatively small diameter are used in lieu of a single wire of larger diameter in order to minimize the resistances and inductances of the wire bond connections, such as described in commonly assigned U.S. Pat. No. 5,043,859 of Korman et al., issued Aug. 27, 1991 and incorporated by reference herein. In an alternative embodiment, as shown in phantom, the source lead S can be made wider, such that the anode A can be connected directly thereto, for situations wherein the source pad of the particular MOSFET is too small to accommodate a multiplicity of wire bonds.

Advantageously, the Schottky wire bond inductance $L_{sch}$ and the MOSFET wire bond inductance $L_{sr}$ (See FIG. 1) of the package configuration of FIG. 2 are reduced significantly, as compared with the wire bond inductance of conventional packaging techniques. Ideally, with zero parasitic inductances $L_{sch}$ and $L_{sr}$, the Schottky diode carries all the load current that would otherwise flow through the MOSFET body diode. Hence, rectification efficiency is improved for all operating frequencies. As a result, high-frequency rectification is practicable with the synchronous rectifier package of FIG. 2.

Figure 3A:
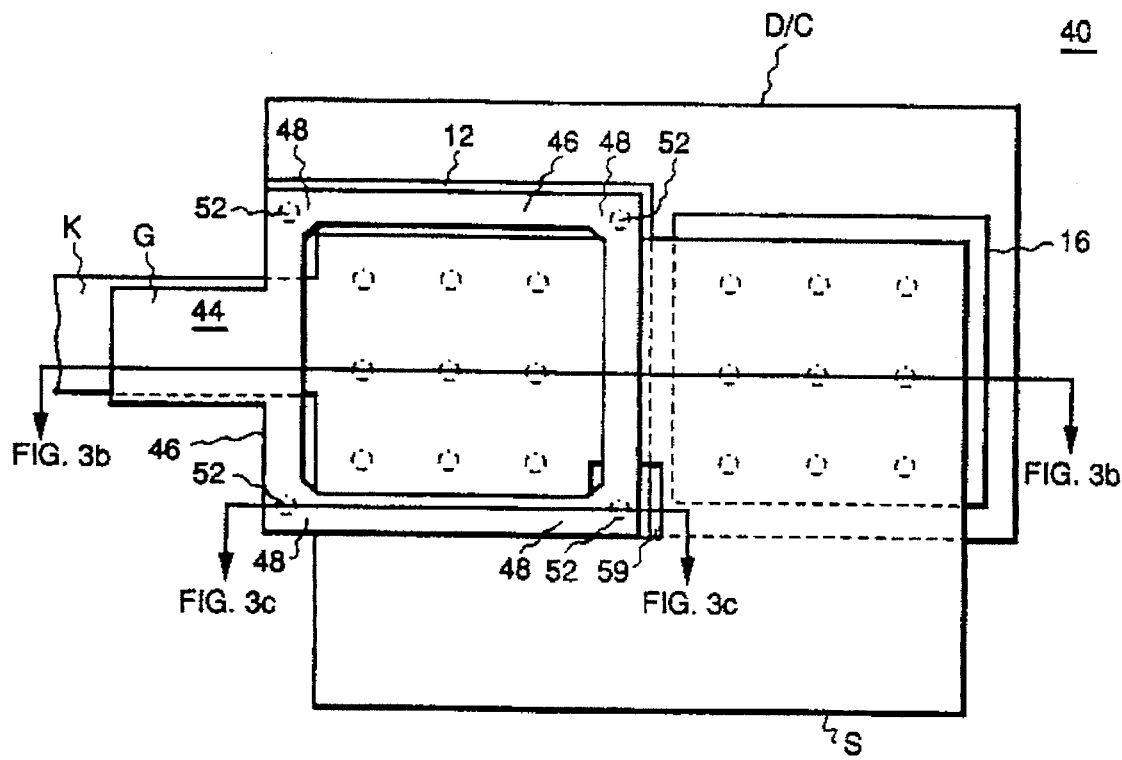
FIGS. 3a is a top view and FIGS. 3b and 3c are side views illustrating an alternative embodiment of a metallized ceramic package for packaging the synchronous rectifier of FIG. 1.
Figure 3B:
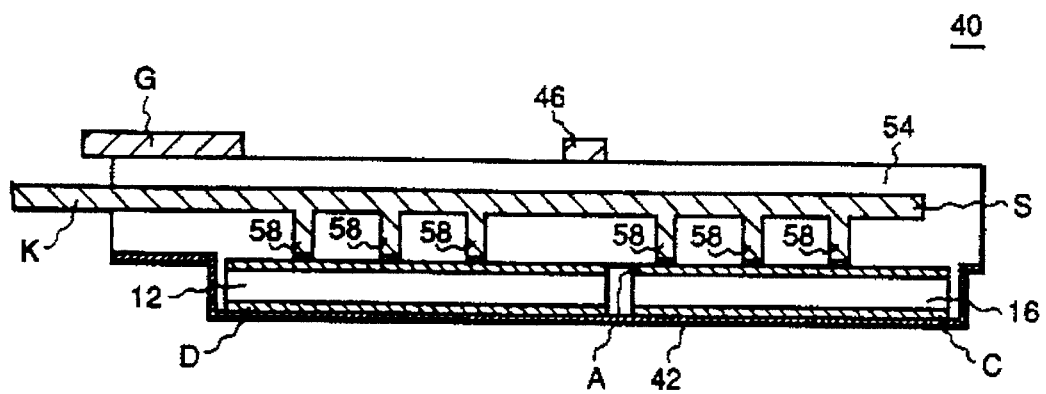
Figure 3C:
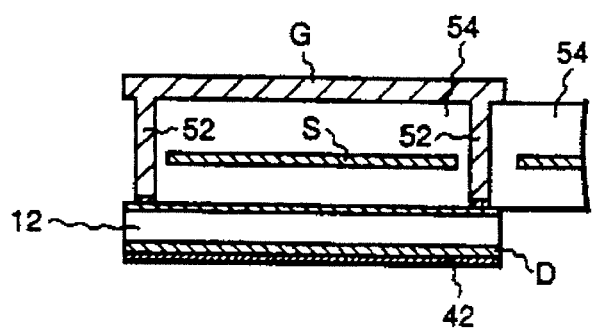

FIGS. 3a–3c illustrate an alternative embodiment of a metallized ceramic package 40 for packaging the synchronous rectifier 10 of FIG. 1. The package of FIGS. 3a–3c is a multi-layer metallized ceramic structure which has no wire bonds, thereby advantageously reducing package inductances and resistances even further.

As shown in FIG. 3b, MOSFET chip 12 and Schottky diode chip 16 are disposed in a conductive container 42 which functions to connect the cathode C to the drain D of the MOSFET. The gate lead G, which forms the top layer of the package, includes a gate tab 44 and a gate runner 46. By way of example, the gate runner 46 is shown as being directly connected to four individual MOSFET gate pads 48. Vias 52 provide electrical connections from gate pads 48 to the gate pads of the MOSFET chip 16 (FIG. 3c).

Commonly assigned, copending U.S. patent application Ser. No. 07/904,310 (RD-21,700) of R. A. Fisher et al., filed Jun. 25, 1992 and incorporated by reference herein, describes a MOSFET having multiple gate pads on a single gate runner, such as that illustrated in FIG. 3a. The cumulative gate resistance and inductance of a discrete power MOSFET having multiple gate pads are substantially reduced and evenly distributed among the individual MOSFET cells of the chip. As a result, resistive and inductive losses due to gate parasitics of the MOSFET are reduced, and gating of the individual MOSFET cells on the chip is substantially synchronized.

As shown in FIG. 3b, the gate lead G and gate runner 46 are separated from the Kelvin and source leads by an insulating layer 54. Connections to the source pad of MOSFET chip 16 and to the anode A of Schottky diode chip 22 are made from the source lead S by vias 58. Additionally, as shown in FIG. 3a, a relatively large aperture 59 is formed in the source lead S in order to ensure that the gate lead G and the source lead S do not make contact within package 40.

Figure 4A:
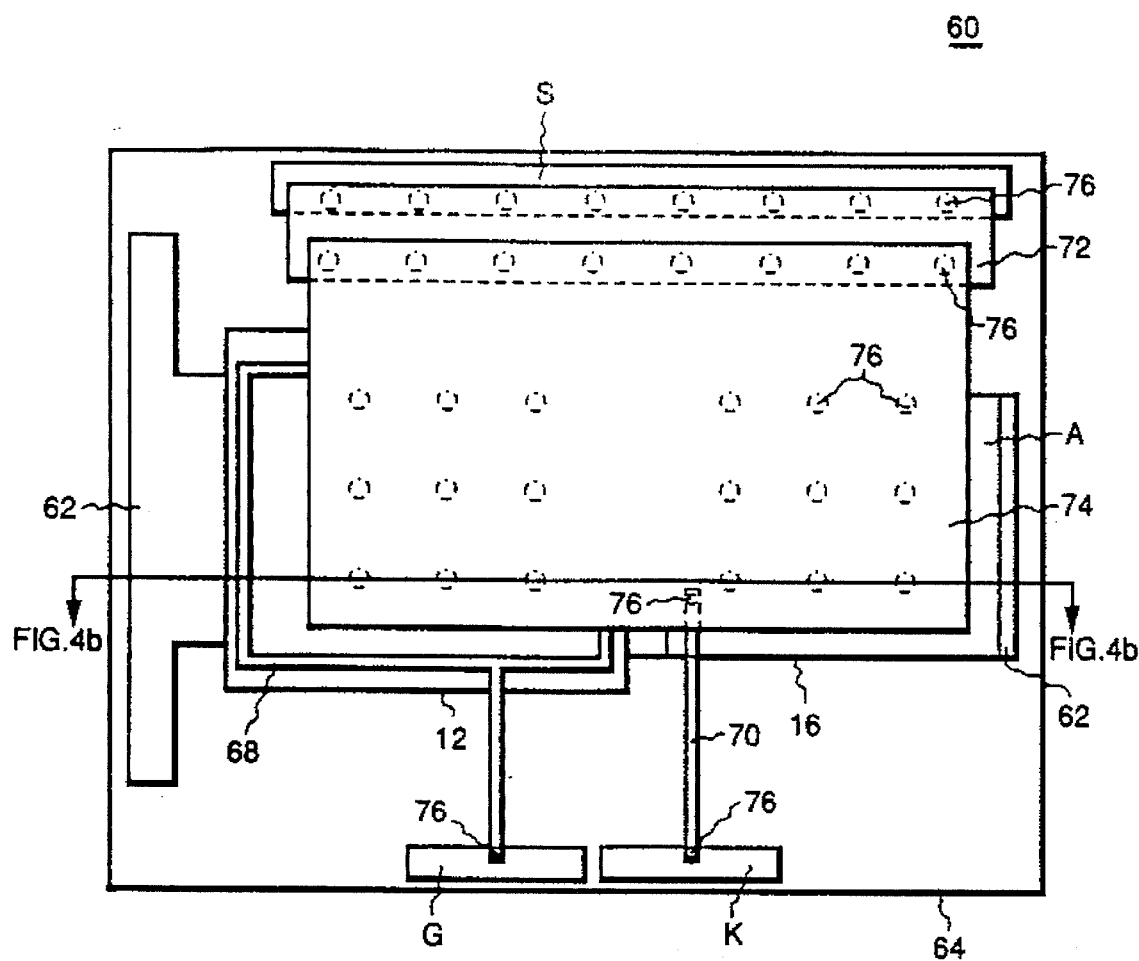
FIGS. 4a and 4b are top and side views, respectively, illustrating an high density interconnect implementation of a synchronous rectifier package for packaging the synchronous rectifier of FIG. 1.
Figure 4B:
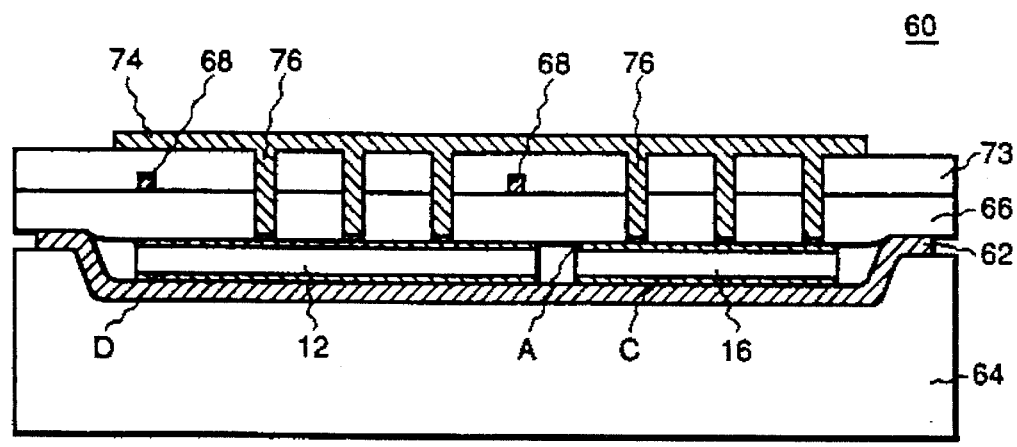

FIGS. 4a–4b illustrate an high density interconnect (HDI) package 60 for packaging the synchronous rectifier of FIG. 1. Commonly assigned U.S. Pat. Nos: 4,835,704 of Eichelberger et al.; 4,933,042 of Eichelberger et al.; 4,783,695 of Eichelberger et al.; 4,780,177 of Wojnarowski et al.; 4,960,613 of Cole et al.; 4,897,153 of Cole et al.; 4,714,516 of Eichelberger et al.; which are each incorporated by reference herein, describe HDI structures. In general, HDI packages typically comprise a plurality of dice on a ceramic substrate which are interconnected by a metal interconnect pattern on a polymer overlay layer that is laminated over the tops of the dice. The metal interconnect pattern can be formed by adaptive laser lithography, such as, for example, described in commonly assigned U.S. Pat. No. 4,835,704, cited hereinabove.

As illustrated in FIGS. 4a–4b, MOSFET die 12 and Schottky diode die 16 are attached to a conductive layer 62 which is attached to an HDI substrate, or back-plane, 64. A presently available method for attaching dice 12 and 16 to substrate 64 involves conventional eutectic die bonding, similar to that employed in the direct bonding process of Webster et al. U.S. Pat. No. 4,996,116, cited hereinabove. Source S, gate G, and Kelvin K leads are also attached to substrate 64 on the same level. A polymer film 66, such as Kapton polyimide film sold by E. I. du Pont de Nemours and Company, is laminated over dice 12 and 16 using a polyetherimide resin or thermoplastic adhesive. The next HDI layer (i.e., the second metal layer) includes a gate runner 68 for attachment between the gate pad of the MOSFET die 12 and gate lead G; a source lead connection 72 for connection to the source lead S; and a Kelvin connection 70 for connection between Kelvin lead K and the third metal layer 74, as shown in phantom in FIG. 4a. Another polymer film layer 73 is disposed on the second metal HDI layer. The third metal HDI layer 74 is finally disposed over the second polymer layer for connection of the source lead S to the dice. In particular, interconnect vias 76 are laser-ablated through the Kapton/adhesive layers to form electrical contact points between: the source layers 72 and 74; the source lead S and the source layer 72; the source layer 74 and the anode A of the Schottky diode die; the source layer 74 and the source pad of the MOSFET die 22; the Kelvin connection 70 and the Kelvin lead K; and the gate runner 68 and the gate lead G. A blanket metallization layer is deposited onto each Kapton surface and extends into all vias, making electrical contact therethrough, as required. Lithographic and subtractive pattern transfer techniques are employed to define the interconnect pattern, with additional interlevel dielectric and metallization layers being added as required.

Figure 5:
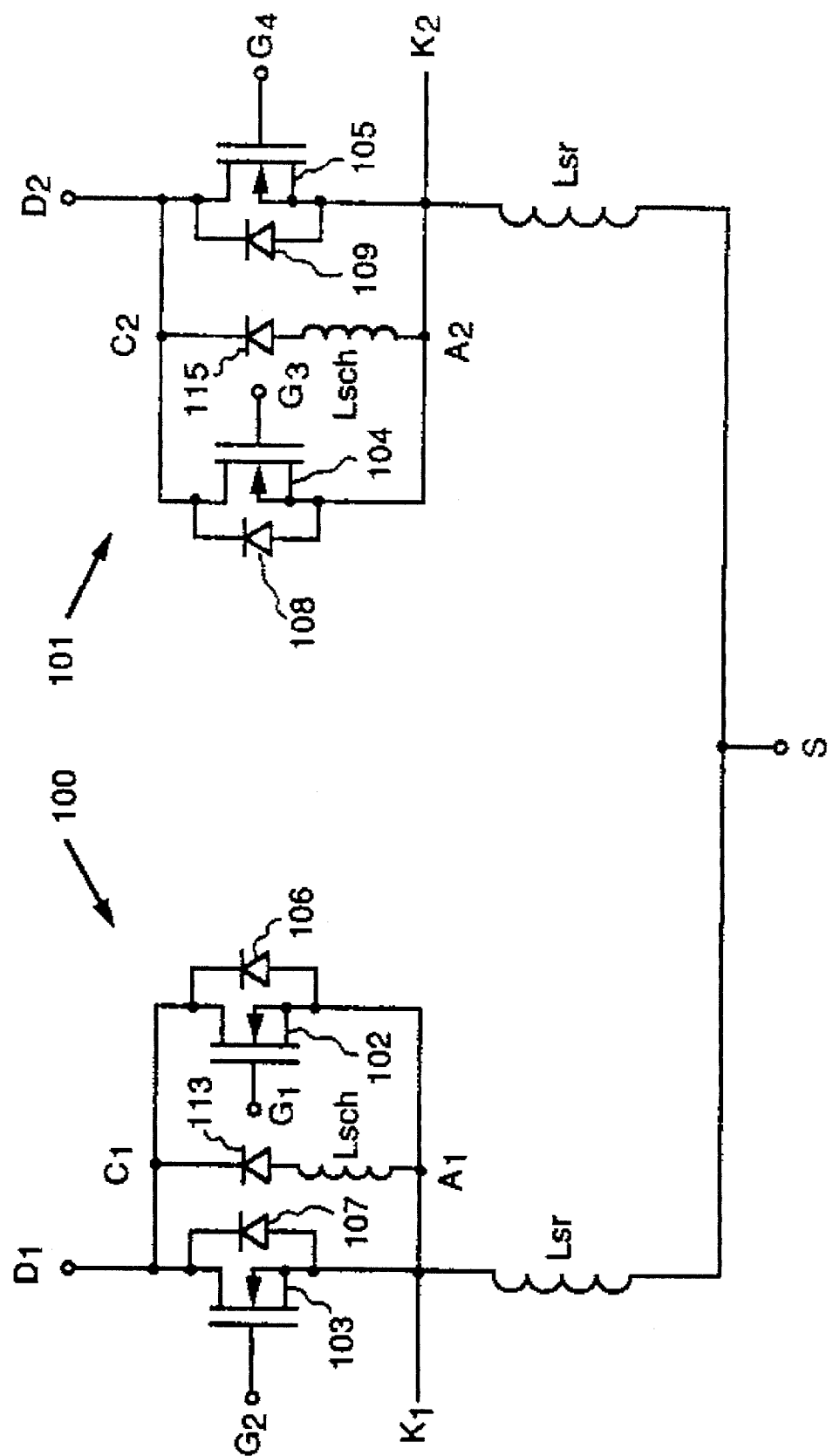
FIG. 5 schematically illustrates a synchronous rectifier bridge for packaging according to the present invention.

FIG. 5 illustrates a bridge, or push-pull, configuration wherein a pair of synchronous rectifiers 100 and 101 conduct current 180° out-of-phase. In the embodiment of FIG. 5, each synchronous rectifier 100 and 101 is illustrated as comprising a pair of parallel-coupled MOSFET's 102–103 and 104–105, respectively. In particular, by coupling MOSFET's in parallel, the on-state resistance of each respective synchronous rectifier is reduced. Each MOSFET 102–105 has an integral body diode 106–109 coupled in parallel therewith. A Schottky diode, 113 and 115, respectively, is coupled in parallel, i.e., with like polarity, with the respective pairs of body diodes, 106–107 and 108–109. (Alternatively, a separate respective Schottky diode could be coupled in parallel with each respective MOSFET body diode, if desired.) As shown, in the embodiment of FIG. 5, the source terminals S of MOSFET's 102–105 are coupled together. By this configuration, MOSFET's 102–105 can be driven with a gate signal referenced to the secondary side ground. However, for applications which do not require a ground-referenced gate drive signal, an alternative bridge configuration may have a common drain connection instead of a common source connection.

Figure 6:
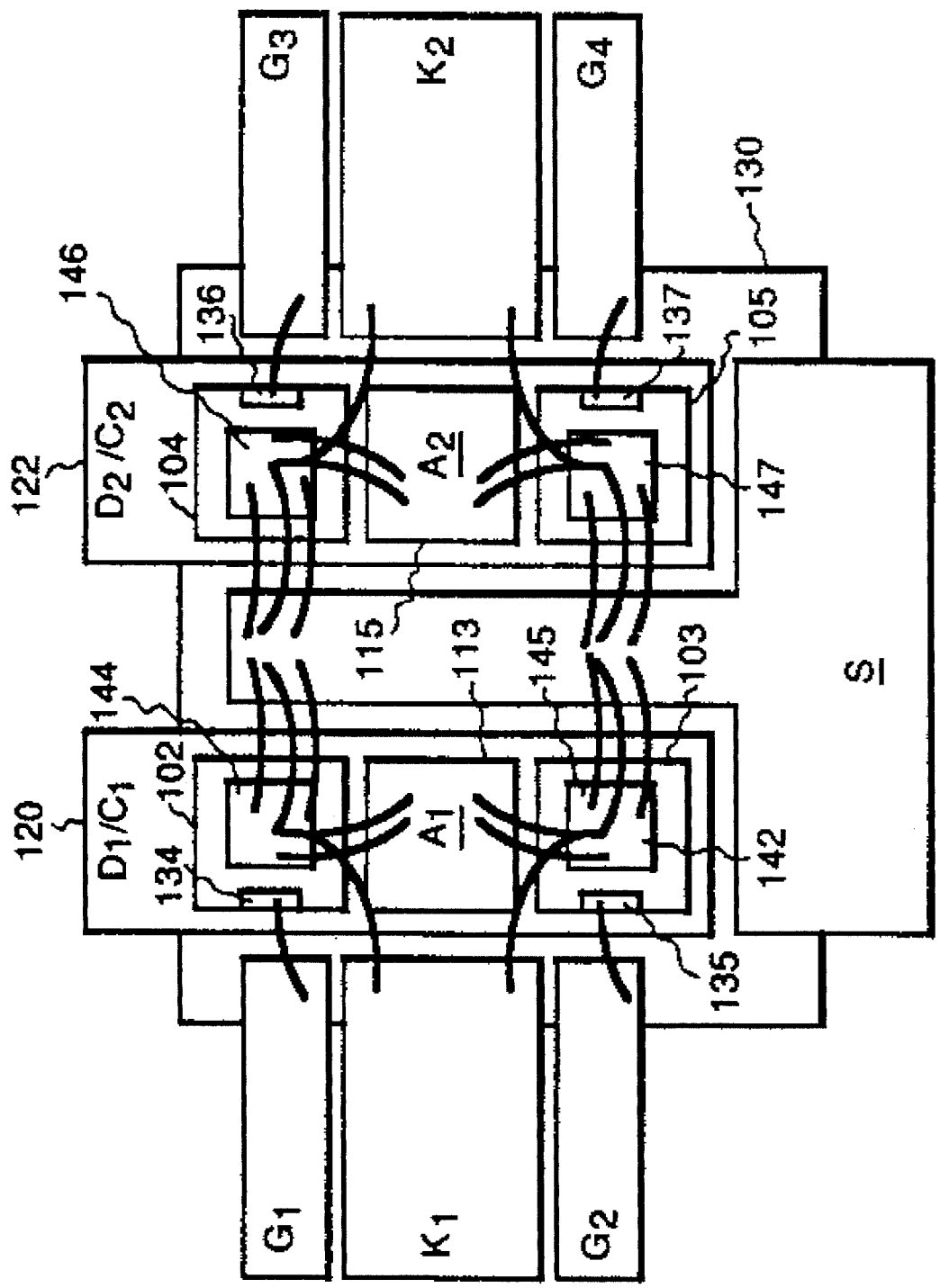
FIG. 6 is a top view illustrating one embodiment of a metallized ceramic package for packaging the synchronous rectifier bridge of FIG. 5 in accordance with the present invention.

FIG. 6 illustrates a metallized ceramic structure for packaging the bridge configuration of FIG. 5 in accordance with the present invention. The drains $D_1$ of MOSFET dice 102 and 103 and the cathode $C_1$ of Schottky diode die 113 share a common lead pad 120 which is bonded to a substrate 130. Likewise, the drains $D_2$ of MOSFET dice 104 and 105 and the cathode $C_2$ of Schottky diode die 115 share a common lead pad 122 which is bonded to substrate 130. The gate leads $G_1$–$G_4$ are each respectively wire bonded to the gate pad 134–137 of the corresponding MOSFET die; and the Kelvin leads $K_1$–$K_2$ are each wire bonded to the respective source pad 144–147 of the corresponding MOSFET die. The anodes $A_1$–$A_2$ of each respective Schottky diode die and the source lead S are wire bonded to the source pad of each of the corresponding MOSFET diode dice. Preferably, as described hereinabove, multiple parallel wire bonds are used for connections to the source pads S instead of a single wire bond. Furthermore, in order to provide a low-inductance, low-resistance current path, the drain leads each have a relatively high width-to-thickness aspect ratio.

Figure 7A:
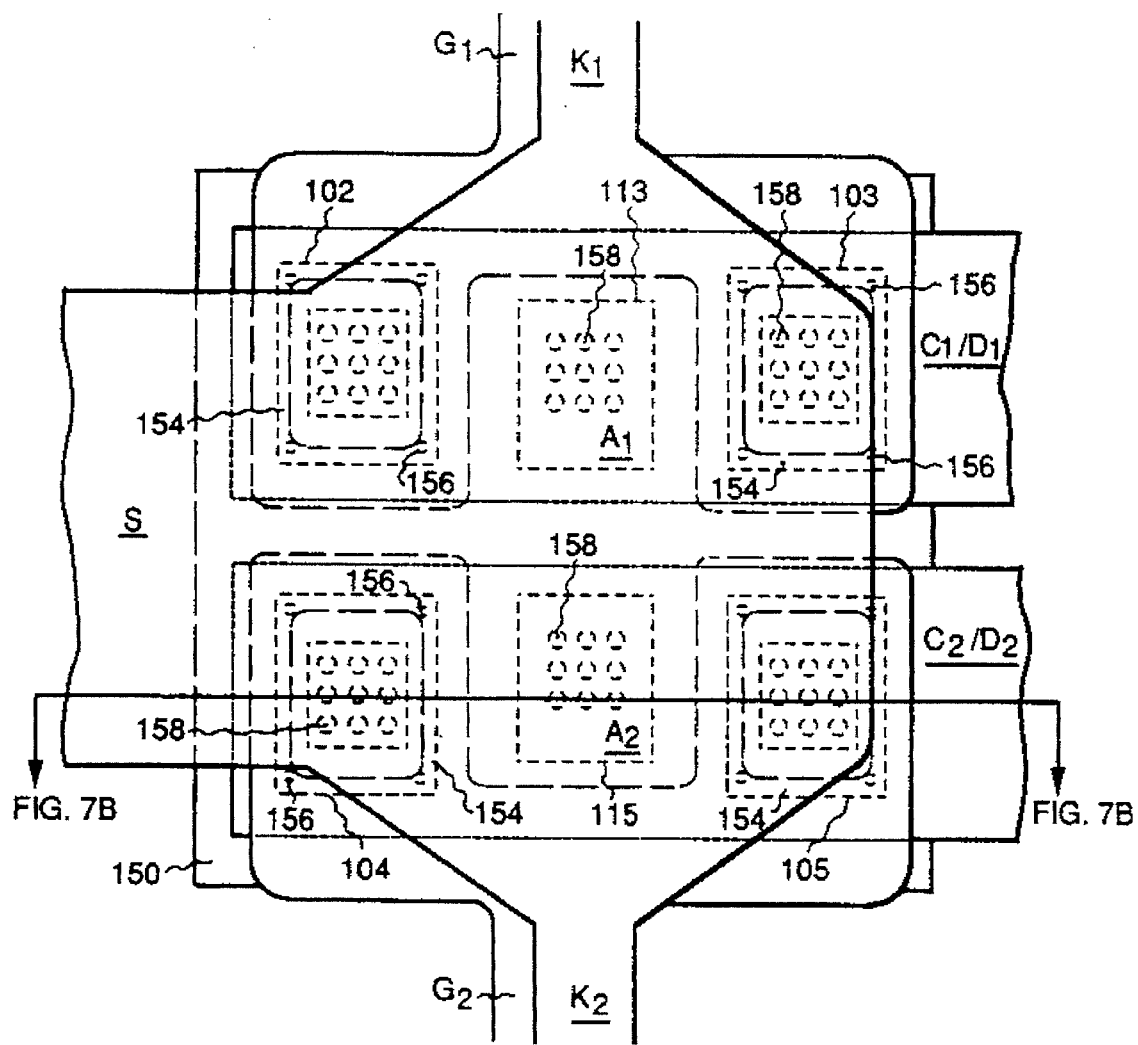
FIGS. 7a is a top view of the layout of an alternative embodiment of a package for the synchronous rectifier bridge of FIG. 5, which may be implemented using either metallized ceramic or high density interconnect technology.

FIGS. 7a is a top view of an alternative embodiment of a synchronous rectifier bridge package for packaging the bridge configuration of FIG. 5. The layout of FIG. 7a may represent either a multilayer metallized ceramic implementation or an HDI implementation of the bridge package. As shown, for either implementation, the cathode $C_2$ of Schottky diode die 115 shares a common lead pad $C_2/D_2$ with the drains $D_2$ of MOSFET's 104 and 105; and the cathode $C_1$ of Schottky diode die 113 shares a common lead pad $C_1/D_1$ with the drains $D_1$ of MOSFET's 102 and 103.

Figure 7B:
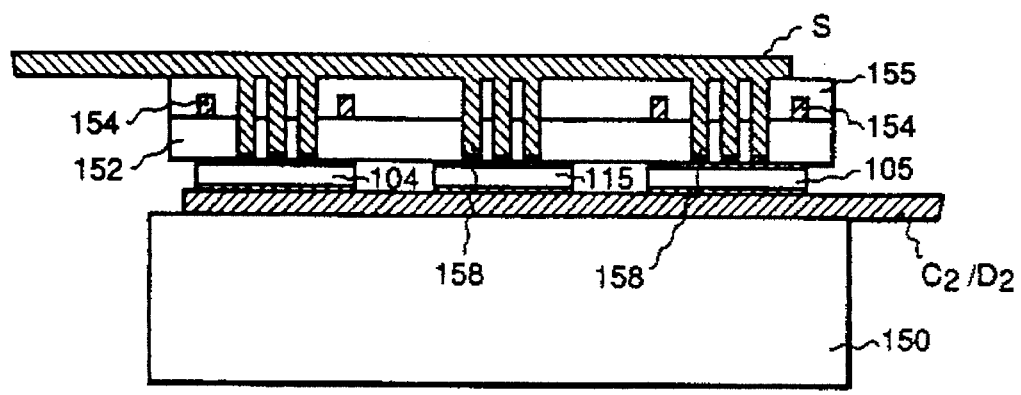
FIG. 7b is a side view of the layout of FIG. 7a for a metallized ceramic implementation of the rectifier bridge of FIG. 5.

FIG. 7b is a side view of the bridge package of FIG. 7a for a metallized ceramic implementation of the rectifier bridge of FIG. 5. The common lead pads are each attached to a ceramic substrate 150. An insulating layer 152 is disposed over the tops of the dice 102–105, 113 and 115. A gate runner 154 is disposed on each MOSFET die with vias 156 formed therein for connection to the respective gate pad on the MOSFET die. The top layer of the package comprises the source lead S with vias 158 formed therein for connection to the anodes $A_1$ and $A_2$ of the Schottky diode dice and the source pads of the MOSFET dice 102–105.

Although the synchronous rectifier package of the present invention has been described herein as employing MOSFET's, it is to be understood that other types of devices may be used to implement synchronous rectifiers, such as bipolar junction transistors or complementary heterojunction FET's. Packages employing such other devices may not require a parallel-coupled Schottky diode, but offer the advantages of the low impedance package, i.e., low gate losses, more precise synchronization of gating signals and higher efficiency, as described hereinabove.

While the preferred embodiments of the present invention have been shown and described herein, it will be obvious that such embodiments are provided by way of example only. Numerous variations, changes and substitutions will occur to those of skill in the art without departing from the invention herein. Accordingly, it is intended that the invention be limited only by the spirit and scope of the appended claims.

What is claimed is:

1. A synchronous rectifier package, comprising:
   at least one transistor configured to operate as a synchronous rectifier, said transistor having a gate, source and drain, said transistor further having an integral body diode having its anode connected to said source and having its cathode connected to said drain;
   a Schottky diode coupled in parallel with said body diode, said Schottky diode and said at least one transistor comprising separate and discrete devices, the cathode of said Schottky diode sharing a common lead pad with said drain of said transistor, the anode of said Schottky diode being coupled directly to said source of said transistor;
   said package being configured to have minimal parasitic inductances and resistances such that said Schottky diode conducts substantially all the device current that would otherwise flow through said body diode during commutation of said transistor, said package comprising a metallized ceramic structure having multiple parallel wire bond connections.

2. The synchronous rectifier package of claim 1, comprising a pair of transistors coupled together in a bridge configuration.

3. The synchronous rectifier package of claim 2 wherein each transistor of said pair is coupled in parallel with at least one additional transistor.

4. The synchronous rectifier of claim 1 wherein said transistor comprises a MOSFET.

5. The synchronous rectifier package of claim 1 wherein said source comprises a source pad connected to a source lead, said anode being connected to said source lead.

6. The synchronous rectifier package of claim 1 wherein said source comprises a source pad connected to a source lead, said anode being connected to said source pad.

7. The synchronous rectifier package of claim 1 wherein said gate of said transistor comprises a plurality of gate pads coupled to each other by a single gate runner, said package having multiple connections to said gate pads such that the gate resistance of said transistor is minimized.

8. A synchronous rectifier package, comprising:
   at least one transistor configured to operate as a synchronous rectifier, said transistor having a gate, source and drain, said transistor further having an integral body diode having its anode connected to said source and having its cathode connected to said drain;

a Schottky diode coupled in parallel with said body dine, said Schottky diode and said at least one transistor comprising separate and discrete devices, the cathode of said Schottky diode sharing a common lead pad with said drain of said transistor, the anode of said Schottky diode being coupled directly to said source of said transistor;

said package being configured to have minimal parasitic inductances and resistances such that said Schottky diode conducts substantially all the device current that would otherwise flow through said body diode during commutation of said transistor, said package comprising a metallized ceramic structure having multiple parallel vias for making electrical connections between layers.

9. The synchronous rectifier package of claim 8 wherein said gate of said transistor comprises a plurality of gate pads coupled to each other by a single gate runner, said package having multiple connections to said gate pads such that the gate resistance of said transistor is minimized.

10. The synchronous rectifier package of claim 8 comprising a pair of transistors coupled together in a bridge configuration.

11. The synchronous rectifier package of claim 10 wherein each transistor of said pair is coupled in parallel with at least one additional transistor.

12. The synchronous rectifier of claim 8 wherein said transistor comprises a MOSFET.

13. The synchronous rectifier package of claim 8 wherein said source comprises a source pad connected to a source lead, said anode being connected to said source lead.

14. The synchronous rectifier package of claim 8 wherein said source comprises a source pad connected to a source lead, said anode being connected to said source pad.

15. A synchronous rectifier package, comprising:

at least one transistor configured to operate as a synchronous rectifier, said transistor having a gate, source and drain, said transistor further having an integral body diode having its anode connected to said source and having its cathode connected to said drain;

a Schottky diode coupled in parallel with said body diode, said Schottky diode and said at least one transistor comprising separate and discrete devices, the cathode of said Schottky diode sharing a common lead pad with said drain of said transistor, the anode of said Schottky diode being coupled directly to said source of said transistor, said package being configured to have minimal parasitic inductances and resistances such that said Schottky diode conducts substantially all the device current that would otherwise flow through said body diode during commutation of said transistor, said package comprising a high density interconnect structure with multiple parallel vias.

16. The synchronous rectifier package of claim 15 wherein said gate of said transistor comprises a plurality of gate pads coupled to each other by a single gate runner, said package having multiple connections to said gate pads such that the gate resistance of said transistor is minimized.

17. The synchronous rectifier package of claim 15 comprising a pair of transistors coupled together in a bridge configuration.

18. The synchronous rectifier package of claim 17 wherein each transistor of said pair is coupled in parallel with at least one additional transistor.

19. The synchronous rectifier of claim 15 wherein said transistor comprises a MOSFET.

20. The synchronous rectifier package of claim 15 wherein said source comprises a source pad connected to a source lead, said anode being connected to said source lead.

21. The synchronous rectifier package of claim 15 wherein said source comprises a source pad connected to a source lead, said anode being connected to said source pad.

\* \* \* \* \*